(12) United States Patent
Shim et al.

(10) Patent No.: US 8,395,251 B2
(45) Date of Patent: Mar. 12, 2013

(54) INTEGRATED CIRCUIT PACKAGE TO PACKAGE STACKING SYSTEM

(75) Inventors: Il Kwon Shim, Singapore (SG); Seng Guan Chow, Singapore (SG); Jeffrey D. Punzalan, Singapore (SG); Byung Joon Han, Singapore (SG); Kambhampati Ramakrishna, Chandler, AZ (US)

(73) Assignee: STATS ChipPac Ltd., Singapore (SG)

( * ) Notice: Subject to any disclaimer, the term of this patent is extended or adjusted under 35 U.S.C. 154(b) by 752 days.

(21) Appl. No.: 11/382,983

(22) Filed: May 12, 2006

(65) Prior Publication Data

US 2007/0108568 A1    May 17, 2007

Related U.S. Application Data

(60) Provisional application No. 60/594,859, filed on May 12, 2005.

(51) Int. Cl.
*H01L 23/043* (2006.01)

(52) U.S. Cl. ............... 257/686; 257/666; 257/E23.001; 257/E23.01; 257/E23.031; 257/E23.043; 257/E23.048

(58) Field of Classification Search .......... None
See application file for complete search history.

(56) References Cited

U.S. PATENT DOCUMENTS

| | | | | |
|---|---|---|---|---|
| 5,608,267 | A  * | 3/1997 | Mahulikar et al. | 257/796 |
| 5,625,221 | A  * | 4/1997 | Kim et al. | 257/686 |
| 5,677,569 | A | 10/1997 | Choi et al. | |
| 5,838,060 | A | 11/1998 | Comer | |
| 6,424,031 | B1 * | 7/2002 | Glenn | 257/686 |
| 6,605,866 | B1 * | 8/2003 | Crowley et al. | 257/692 |
| 6,828,665 | B2 | 12/2004 | Pu et al. | |
| 6,977,431 | B1 * | 12/2005 | Oh et al. | 257/696 |
| 2003/0062601 | A1 * | 4/2003 | Harnden et al. | 257/666 |
| 2003/0129271 | A1 * | 7/2003 | Tandy | 425/117 |
| 2004/0026773 | A1 * | 2/2004 | Koon et al. | 257/692 |
| 2005/0127494 | A1 * | 6/2005 | Liu | 257/696 |
| 2005/0133916 | A1 | 6/2005 | Karnezos | |
| 2006/0027841 | A1 | 2/2006 | Tamaki | |

* cited by examiner

*Primary Examiner* — Fei Fei Yeung Lopez
(74) *Attorney, Agent, or Firm* — Ishimaru & Associates LLP; Mikio Ishimaru (57) ABSTRACT

An integrated circuit package to package stacking system is provided including providing a first integrated circuit package, having a configured leadframe, providing a second integrated circuit package, having the configured leadframe, and forming an integrated circuit package pair by electrically connecting the configured leadframe of the first integrated circuit package to the configured leadframe of the second integrated circuit package.

14 Claims, 7 Drawing Sheets

INTEGRATED CIRCUIT PACKAGE TO PACKAGE STACKING SYSTEM

CROSS-REFERENCE TO RELATED APPLICATION

This application claims the benefit of U.S. Provisional Patent Application Ser. No. 60/594,859 filed May 12, 2005, and the subject matter thereof is hereby incorporated herein by reference thereto.

TECHNICAL FIELD

The present invention relates generally to integrated circuit packaging, and more particularly to a system for stacking multiple known good integrated circuit packages.

BACKGROUND ART

Modem consumer electronics, such as smart phones, personal digital assistants, and location based services devices, as well as enterprise electronics, such as servers and storage arrays, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

In response to the demands for improved packaging, many innovative package designs have been conceived and brought to market. The multi-chip module has achieved a prominent role in reducing the board space used by modern electronics. However, multi-chip modules, whether vertically or horizontally arranged, can also present problems because they usually must be assembled before the component chips and chip connections can be tested. That is, because the electrical bond pads on a die are so small, it is difficult to test die before assembly onto a substrate. Thus, when die are mounted and connected individually, the die and connections can be tested individually, and only known-good-die ("KGD") that is free of defects is then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process yield problems.

Numerous package approaches stack multiple integrated circuit dice or package in package (PIP) or a combination. Other approaches include package level stacking or package on package (POP). Both concepts include stacking of two or more packages. KGD and assembly process yields are not an issue since each package can be tested prior to assembly, allowing KGD to be used in assembling the stack. But stacking integrated devices, package-in-package, package-on-package, or combination thereof have assembly process difficulties caused by leaded packages having limited input and output (I/O) which limits its role in 3D packaging. Current leaded packages also do not provide the flexibility to support the various integration and stacking options described earlier with the higher I/O count support.

Thus, a need still remains for an integrated circuit package to package stacking system providing low cost manufacturing, improved yield, reduce the integrated circuit package dimensions and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package to package stacking system comprising providing a first integrated circuit package, having a configured leadframe, providing a second integrated circuit package, having the configured leadframe, and forming an integrated circuit package pair by electrically connecting the configured leadframe of the first integrated circuit package to the configured leadframe of the second integrated circuit package.

Certain embodiments of the invention have other aspects in addition to or in place of those mentioned or are obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the apparatus/device are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

The term "horizontal" as used herein is defined as a plane parallel to the conventional plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes stamping, forging, patterning, exposure, development, etching, cleaning, and/or removal of the material or laser trimming as required in forming a described structure.

Figure 1:
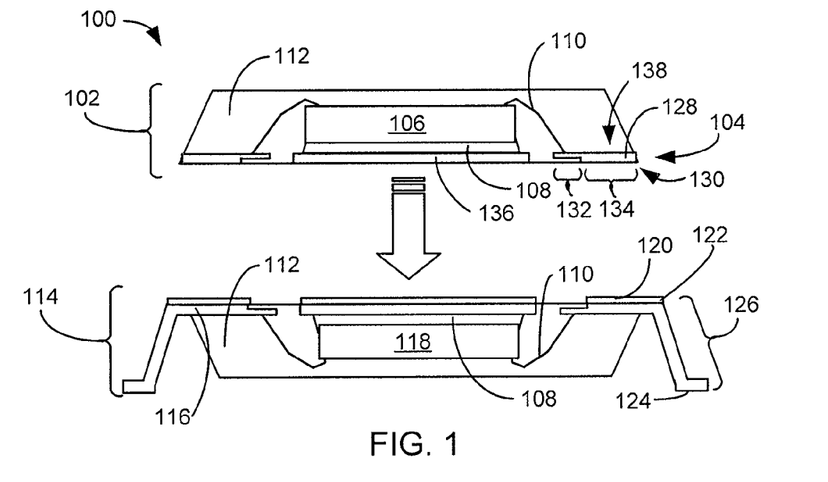
FIG. 1 is a cross-sectional view of two integrated circuit packages being stacked in an integrated circuit package to package stacking system, in an embodiment of the present invention.

Referring now to FIG. 1, therein is shown a cross-sectional view of two integrated circuit packages being stacked in an integrated circuit package to package stacking system 100, in an embodiment of the present invention. The cross-sectional view depicts a first integrated circuit package 102, having a leadless leadframe 104. A first integrated circuit 106 is mounted on the leadless leadframe 104 with die attach material 108, and is electrically connected by electrical interconnects 110, such as bond wires, solder bumps, solder columns, or stud bumps. A packaging material 112, such as plastic or ceramic, is injected to form the body of the first integrated circuit package 102. The leadless leadframe 104 includes an exposed die pad 136 and a lead 128. The lead 128 includes a lead body 134 with a first thickness and a lead anchor 132 having a second thickness wherein the first thickness is greater than the second thickness. The lead body 134 has an exposed surface 130 and a non-exposed surface 138 opposite the exposed surface 130. The non-exposed surface 138 is planar with a surface of the lead anchor 132. The lead anchor 132 is restrained by the packaging material 112 and resistant to shear forces applied to the lead body 134.

A second integrated circuit package 114 has a configured leadframe 116, such as a gull wing or J-lead leadframe, and a second integrated circuit 118. The second integrated circuit 118 is attached to the configured leadframe 116, such as a gull wing or J-lead leadframe, by the die attach material 108, and electrically connected by the electrical interconnects 110. The body of the second integrated circuit package 114 comprises the packaging material 112 injected on the configured leadframe 116, such as a gull wing or J-lead leadframe, the electrical interconnects 110 and the second integrated circuit 118. The conductive layer of an interconnect material 120, such as solder paste, is adhered to an upper mounting surface 122 of the configured leadframe 116, such as a gull wing or J-lead leadframe. A lower mounting surface 124 is also available for connection to the next level of system (not shown). The configured leadframe 116 has exposed a die pad and the upper mounting surface 122 to be coplanar with and extending past the peripheral edge of the top surface of the packaging material 112 of the package body. A configured lead 126, such as a gull wing-lead or a J-lead, extends laterally beyond the packaging material 112 and is bent to allow the second integrated circuit package 114 to have a clearance above the lower mounting surface 124.

Figure 2:
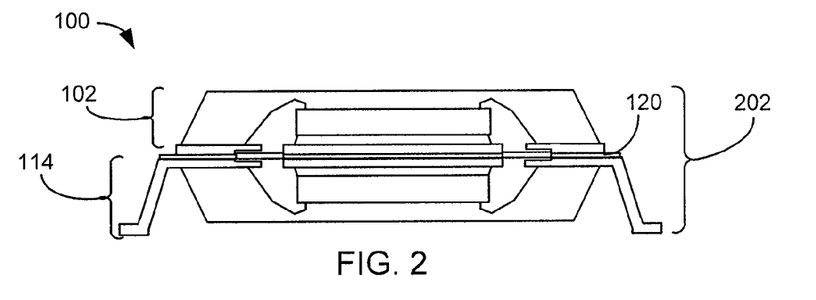
FIG. 2 is a cross-sectional view of the integrated circuit package to package stacking system, shown in FIG. 1.

Referring now to FIG. 2, therein is shown a cross-sectional view of the integrated circuit package to package stacking system 100, shown in FIG. 1. The cross-sectional view depicts the integrated circuit package to package stacking system 100 formed by assembling the first integrated circuit package 102 and the second integrated circuit package 114. A layer of the interconnect material 120 is placed on the second integrated circuit package 114. The first integrated circuit package 102 is placed on the second integrated circuit package 114, by a pick and place machine (not shown). Both the first integrated circuit package 102 and the second integrated circuit package 114 have been previously tested and are known good. A reflow process is used to electrically connect the two known good packages into an integrated circuit package pair 202.

Figure 3:
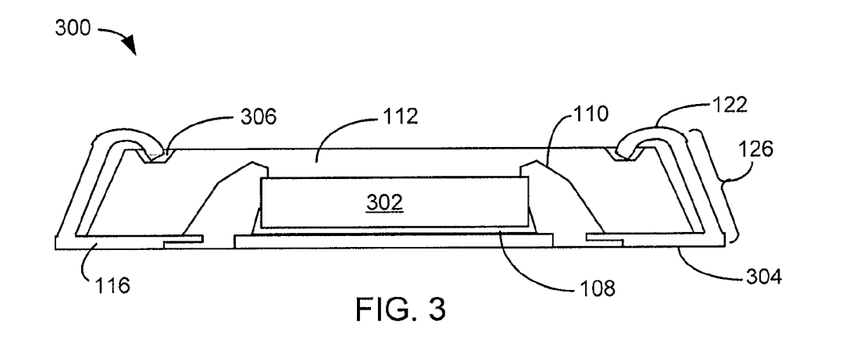
FIG. 3 is a cross-sectional view of a J-lead integrated circuit package, in an embodiment of the present invention.

Referring now to FIG. 3, therein is shown a cross-sectional view of a J-lead integrated circuit package 300, in an embodiment of the present invention. The cross-sectional view depicts an integrated circuit 302 attached to the configured leadframe 116, such as a gull wing or J-lead leadframe, by the die attach material 108, of FIG. 1. The integrated circuit 302 is electrically connected to the configured leadframe 116, of FIG. 1, such as a gull wing or J-lead leadframe, by the electrical interconnects 110, of FIG. 1. The body of the J-lead integrated circuit package 300 is formed of the packaging material 112, of FIG. 1. A lead recess 306 is formed in the body of the J-lead integrated circuit package 300, in order to protect the ends of the configured leadframe 116, such as a gull wing or J-lead leadframe. The lead recess 306 is formed in the top side of the integrated circuit package 300 on the non-vertical side opposite from the lower mounting surface 304. The lead recess 306 is positioned at an offset distance from the edge of the packaging material 112. The lead recess 306 and the end of the configured leadframe 116 interlock to prevent the configured leadframe 116 from moving in lateral direction. The configured lead 126, of FIG. 1, includes the upper mounting surface 122, of FIG. 1, and the lower mounting surface 304 that may be used to connect to the next level of system (not shown).

Figure 4:
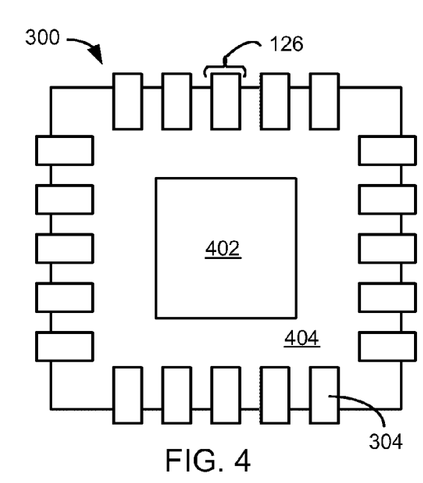
FIG. 4 is a bottom view of the J-lead integrated circuit package structure of FIG. 3.

Referring now to FIG. 4, therein is shown a bottom view of the J-lead integrated circuit package 300 structure of FIG. 3. The bottom view of the J-lead integrated circuit package 300 structure depicts an exposed die pad 402, a package bottom 404, and the lower mounting surface 304. The exposed die pad 402 may be used as a heat sink if attached to the printed circuit board (not shown) or as an attaching pad for stacking integrated circuit packages (not shown). The configured lead 126, of FIG. 1, is used as signal interconnects.

Figure 5:
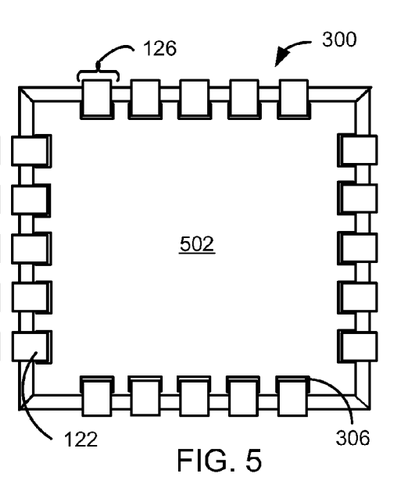
FIG. 5 is a top view of the J-lead integrated circuit package structure of FIG. 3.

Referring now to FIG. 5, therein is shown a top view of the J-lead integrated circuit package 300 structure of FIG. 3. The top view of the J-lead integrated circuit package 300 depicts a package top 502, the lead recess 306, of FIG. 3, and the upper mounting surface 122, of FIG. 1. The package top 502 is molded of packaging material, such as ceramic or plastic insulator, having the lead recess 306, of FIG. 3, positioned around the edges of the J-lead integrated circuit package 300. The lead recess 306 protects the ends of the configured lead 126, of FIG. 1, that bend into the opening.

Figure 6:
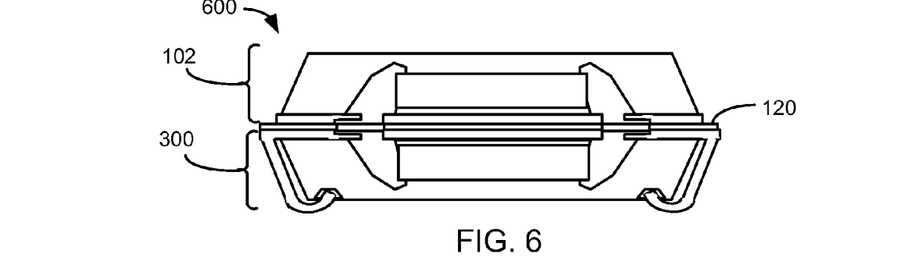
FIG. 6 is a cross-sectional view of the integrated circuit package to package stacking system, in a further embodiment of the present invention.

Referring now to FIG. 6, therein is shown a cross-sectional view of an integrated circuit package to package stacking system 600, in a further embodiment of the present invention. The cross-sectional view of the integrated circuit package to package stacking system 600 depicts the first integrated circuit package 102, of FIG. 1, and the J-lead integrated circuit package 300, of FIG. 3, joined by the interconnect material 120, of FIG. 1. By using the J-lead integrated circuit package 300 for attachment to a printed circuit board (not shown), the minimum amount of space is used for the package outline.

Figure 7:
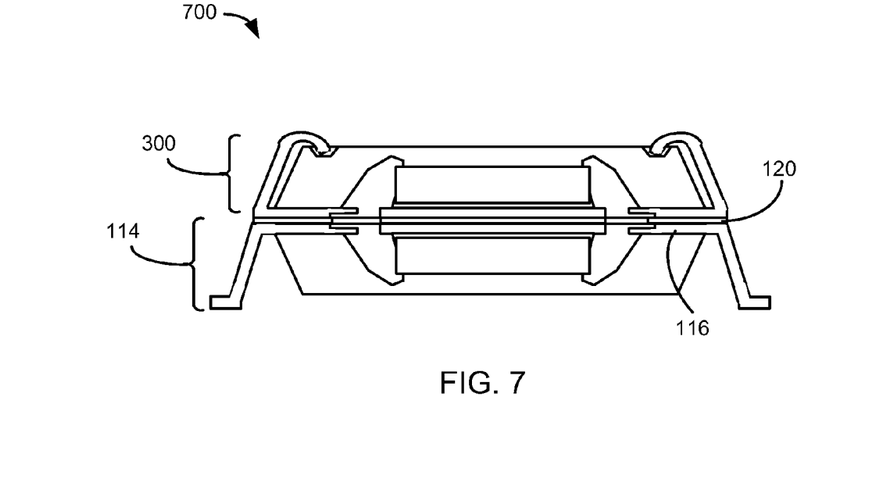
FIG. 7 is a cross-sectional view of the integrated circuit package to package stacking system, in a second embodiment of the present invention.

Referring now to FIG. 7, therein is shown a cross-sectional view of an integrated circuit package to package stacking system 700, in a second embodiment of the present invention. The cross-sectional view of the integrated circuit package to package stacking system 700 depicts the J-lead integrated circuit package 300, of FIG. 3, mounted over the second integrated circuit package 114, of FIG. 1, having the configured leadframe 116, such as a gull wing or J-lead leadframe, of FIG. 1. The J-lead integrated circuit package 300 is attached to the second integrated circuit package 114 by the interconnect material 120, such as solder paste.

Figure 8:
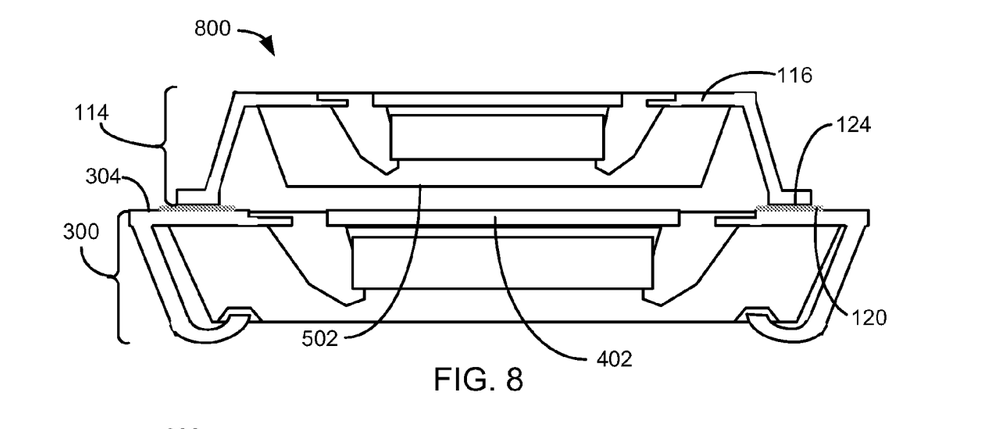
FIG. 8 is a cross-sectional view of the integrated circuit package to package stacking system, in a third embodiment of the present invention.

Referring now to FIG. 8, therein is shown a cross-sectional view of an integrated circuit package to package stacking system 800, in a third embodiment of the present invention. The cross-sectional view of the integrated circuit package to package stacking system 800 depicts the J-lead integrated circuit package 300, of FIG. 3, in an inverted position, as the base of the package to package stack. The second integrated circuit package 114, of FIG. 1, having the configured leadframe 116, such as a gull wing or J-lead leadframe, of FIG. 1, is mounted on the bottom of the J-lead integrated circuit package 300. The interconnect material 120 makes an electrical connection between the lower mounting surface 304, of FIG. 3, of the J-lead integrated circuit package 300 and the lower mounting surface 124, of FIG. 1, of the second integrated circuit package 114, of FIG. 1. The space between the exposed die pad 402 of the J-lead integrated circuit package 300 and the package top 502 of the second integrated circuit package 114 allows for a convection cooling between the packages.

Figure 9:
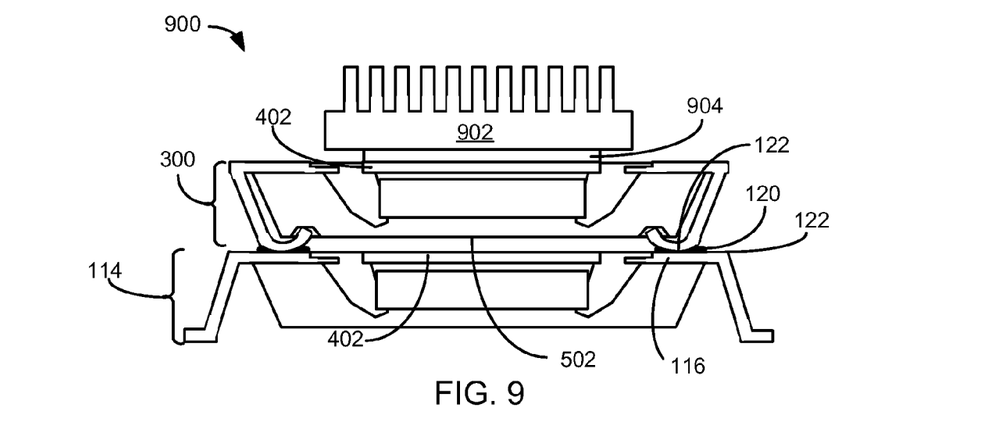
FIG. 9 is a cross-sectional view of the integrated circuit package to package stacking system, in a fourth embodiment of the present invention.

Referring now to FIG. 9, therein is shown a cross-sectional view of an integrated circuit package to package stacking system 900, in a fourth embodiment of the present invention. The cross-sectional view of the integrated circuit package to package stacking system 900 depicts the second integrated circuit package 114, of FIG. 1, having the configured leadframe 116, such as a gull wing or J-lead leadframe, of FIG. 1, as the base package of the integrated circuit package to package stacking system 900. The J-lead integrated circuit package 300, of FIG. 3, is mounted in an inverted position on the second integrated circuit package 114. The interconnect material 120, of FIG. 1, makes an electrical connection between the upper mounting surface 122, of FIG. 1, of the J-lead integrated circuit package 300 and the upper mounting surface 122, of FIG. 1, of the second integrated circuit package 114. The space between the exposed die pad 402 of the second integrated circuit package 114 and the package top 502 of the J-lead integrated circuit package 300 provides a convection cooling between the packages.

A heat sink 902 may be added to the top of the integrated circuit package to package stacking system 900 in order to facilitate additional cooling capability. The heat sink 902 is adhered to the exposed die pad 402, of FIG. 4, by an adhesive 904, such as thermal epoxy. The additional cooling capacity enables the integrated circuit package to package stacking system 900 to be used with both high power and low power integrated circuits or in adverse thermal environments.

Figure 10:
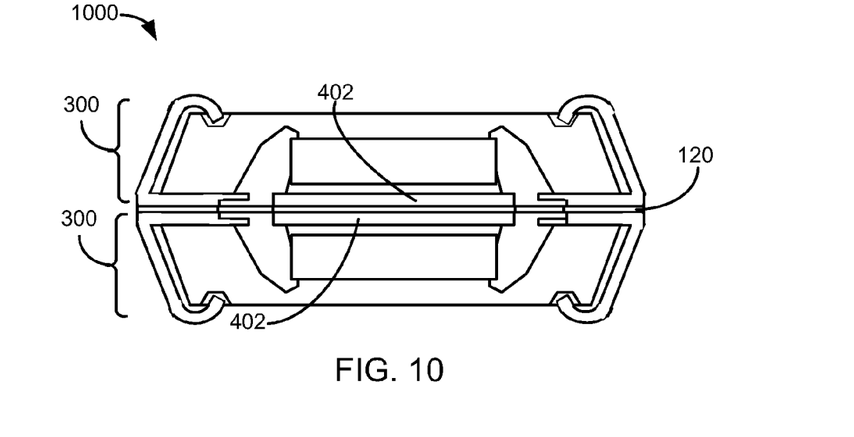
FIG. 10 is a cross-sectional view of the integrated circuit package to package stacking system, in a fifth embodiment of the present invention.

Referring now to FIG. 10, therein is shown a cross-sectional view of an integrated circuit package to package stacking system 1000, in a fifth embodiment of the present invention. The cross-sectional view of the integrated circuit package to package stacking system 1000 depicts two of the J-lead integrated circuit package 300, of FIG. 3, joined in a bottom to bottom configuration. The lower of the J-lead integrated circuit package 300 is in an inverted position the upper of the J-lead integrated circuit package 300, in an upright position, is electrically connected by the interconnect material 120, of FIG. 1. The exposed die pad 402, of FIG. 4, of both of the J-lead integrated circuit package 300 are aligned and joined with the interconnect material 120. This configuration allows for minimum space consumed on the printed circuit board (not shown).

Figure 11:
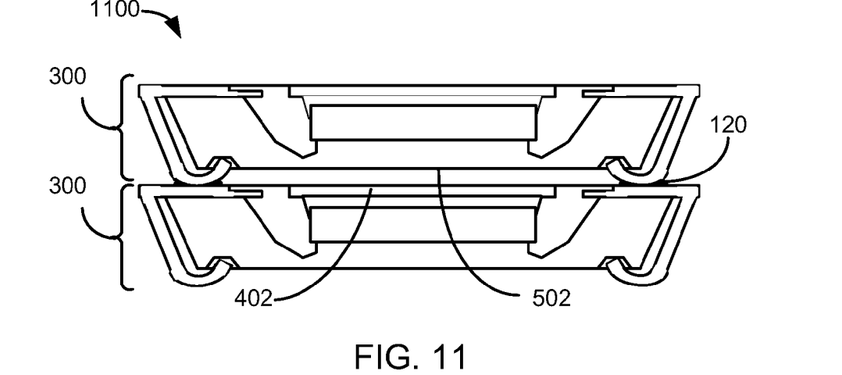
FIG. 11 is a cross-sectional view of the integrated circuit package to package stacking system, in a sixth embodiment of the present invention.

Referring now to FIG. 11, therein is shown a cross-sectional view of an integrated circuit package to package stacking system 1100, in a sixth embodiment of the present invention. The a cross-sectional view of the integrated circuit package to package stacking system 1100 depicts two of the J-lead integrated circuit package 300, of FIG. 3, joined in an inverted stack. The lower of the J-lead integrated circuit package 300 is in an inverted position and the upper of the J-lead integrated circuit package 300 is as well inverted. The upper of the J-lead integrated circuit package 300 is electrically attached to the lower of the J-lead integrated circuit package 300 by the interconnect material 120, of FIG. 1. The space between the exposed die pad 402, of FIG. 4, in the lower of the J-lead integrated circuit package 300 and the package top 502, of FIG. 5, in the upper of the J-lead integrated circuit package 300 allows for a convection cooling between the packages.

Figure 12:
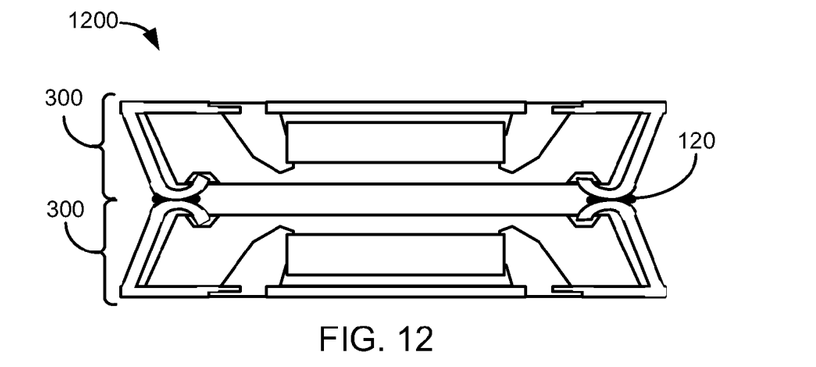
FIG. 12 is a cross-sectional view of the integrated circuit package to package stacking system, in a seventh embodiment of the present invention.

Referring now to FIG. 12, therein is shown a cross-sectional view of an integrated circuit package to package stacking system 1200, in a seventh embodiment of the present invention. The cross-sectional view of the integrated circuit package to package stacking system 1200 depicts two of the J-lead integrated circuit package 300, of FIG. 3, joined in a top to top stack. The lower of the J-lead integrated circuit package 300 is in an upright position and the upper of the J-lead integrated circuit package 300 is in an inverted position. The two packages are joined by the interconnect material 120, of FIG. 1.

Figure 13:
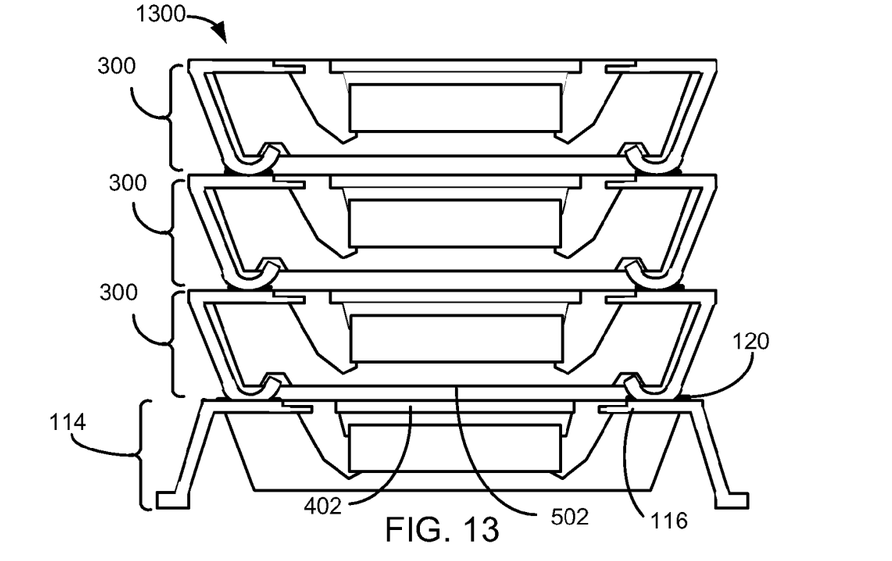
FIG. 13 is a cross-sectional view of the integrated circuit package to package stacking system, in a eighth embodiment of the present invention.

Referring now to FIG. 13, therein is shown a cross-sectional view of an integrated circuit package to package stacking system 1300, in a eighth embodiment of the present invention. The cross-sectional view of the integrated circuit package to package stacking system 1300 depicts a four package stack including three of the J-lead integrated circuit package 300, of FIG. 3, and one of the second integrated circuit package 114, of FIG. 1, having the configured leadframe 116, of FIG. 1, such as a gull wing or J-lead leadframe. The second integrated circuit package 114 is the base package with three of the J-lead integrated circuit package 300 mounted in a stack in the inverted position. Each of the J-lead integrated circuit package 300 is mounted on the lower package and electrically connected by the interconnect material 120, of FIG. 1. Each of the packages has an air gap formed by the exposed die pad 402, of FIG. 4, of the lower package and the package top 502, of FIG. 5, of the upper package.

Figure 14:
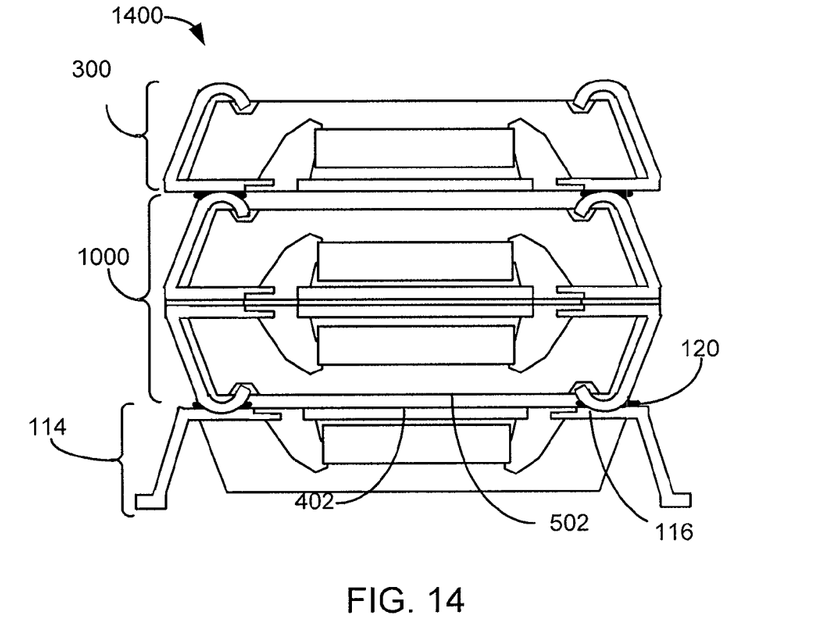
FIG. 14 is a cross-sectional view of the integrated circuit package to package stacking system, in a ninth embodiment of the present invention.

Referring now to FIG. 14, therein is shown a cross-sectional view of an integrated circuit package to package stacking system 1400, in a ninth embodiment of the present invention. The cross-sectional view of the integrated circuit package to package stacking system 1400 depicts a four package stack including three of the J-lead integrated circuit package 300, of FIG. 3, and one of the second integrated circuit package 114, of FIG. 1, having the configured leadframe 116, of FIG. 1, such as a gull wing or J-lead leadframe. The second integrated circuit package 114 is the base package with three of the J-lead integrated circuit package 300 mounted in a stack on the second integrated circuit package 114. Above the second integrated circuit package 114 a pair of the J-lead integrated circuit package 300 are mounted in the back to back configuration of the integrated circuit package to package stacking system 1000, of FIG. 10. The third package of the J-lead integrated circuit package 300 is mounted in an upright position. An air gap formed by the exposed die pad 402, of FIG. 4, of the lower package and the package top 502, of FIG. 5, of the upper package allows a convection cooling between the packages.

Figure 15:
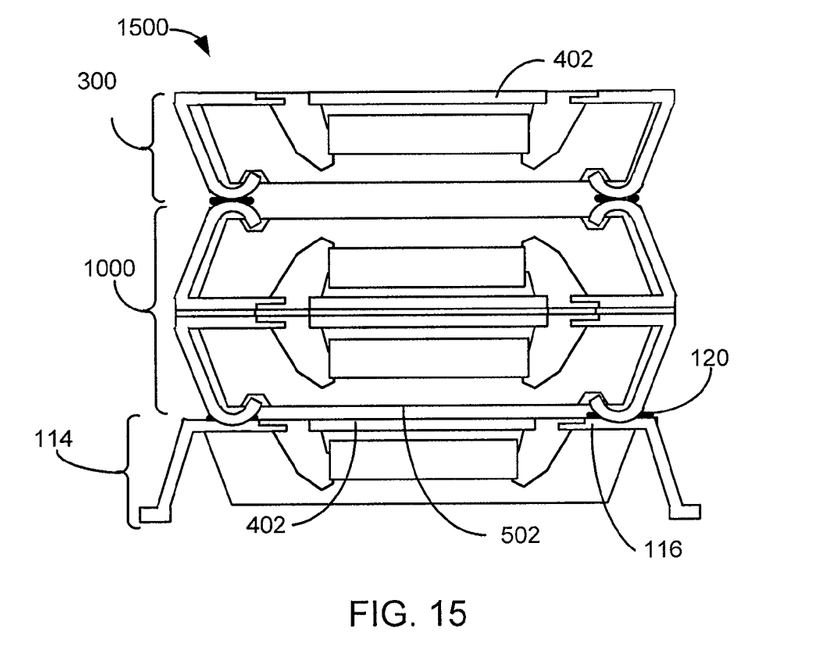
FIG. 15 is a cross-sectional view of the integrated circuit package to package stacking system, in a tenth embodiment of the present invention.

Referring now to FIG. 15, therein is shown a cross-sectional view of an integrated circuit package to package stacking system 1500, in a tenth embodiment of the present invention. The cross-sectional view of the integrated circuit package to package stacking system 1500 depicts a four package stack including three of the J-lead integrated circuit package 300, of FIG. 3, and one of the second integrated circuit package 114, of FIG. 1, having the configured leadframe 116, such as a gull wing or J-lead leadframe, of FIG. 1. The second integrated circuit package 114 is the base package with three of the J-lead integrated circuit package 300 mounted in a stack on the second integrated circuit package 114. Above the second integrated circuit package 114 a pair of the J-lead integrated circuit package 300 are mounted in the back to back configuration of the integrated circuit package to package stacking system 1000, of FIG. 10. The third package of the J-lead integrated circuit package 300 is mounted in an inverted position. An air gap formed by the exposed die pad 402, of FIG. 4, of the lower package and the package top 502, of FIG. 5, of the upper package allows a convection cooling between the packages.

Figure 16:
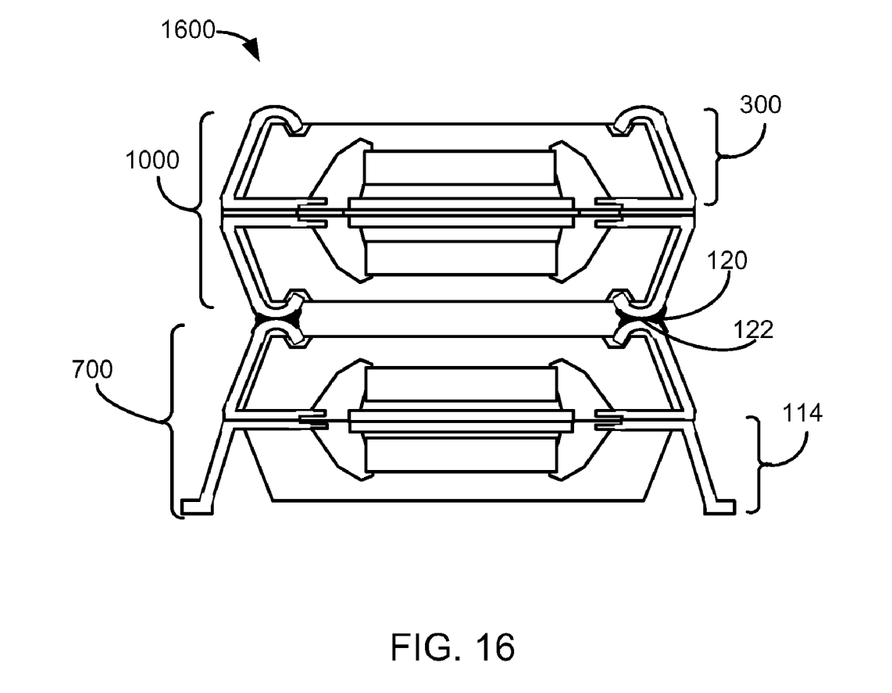
FIG. 16 is a cross-sectional view of the integrated circuit package to package stacking system, in an eleventh embodiment of the present invention.

Referring now to FIG. 16, therein is shown a cross-sectional view of an integrated circuit package to package stacking system 1600, in an eleventh embodiment of the present invention. The cross-sectional view of the integrated circuit package to package stacking system 1600 depicts a four package stack comprising the integrated circuit package to package stacking system 1000, of FIG. 10, and the integrated circuit package to package stacking system 700, of FIG. 7. The integrated circuit package to package stacking system 1000 comprises a pair of the J-lead integrated circuit package 300, of FIG. 3 mounted bottom to bottom. The integrated circuit package to package stacking system 700 comprises the second integrated circuit package 114, of FIG. 1, with one of the J-lead integrated circuit package 300 mounted on top. These two package stacks are joined by the interconnect material 120, of FIG. 1, between the upper mounting surface 122, of FIG. 1, of the J-lead integrated circuit package 300.

Figure 17:
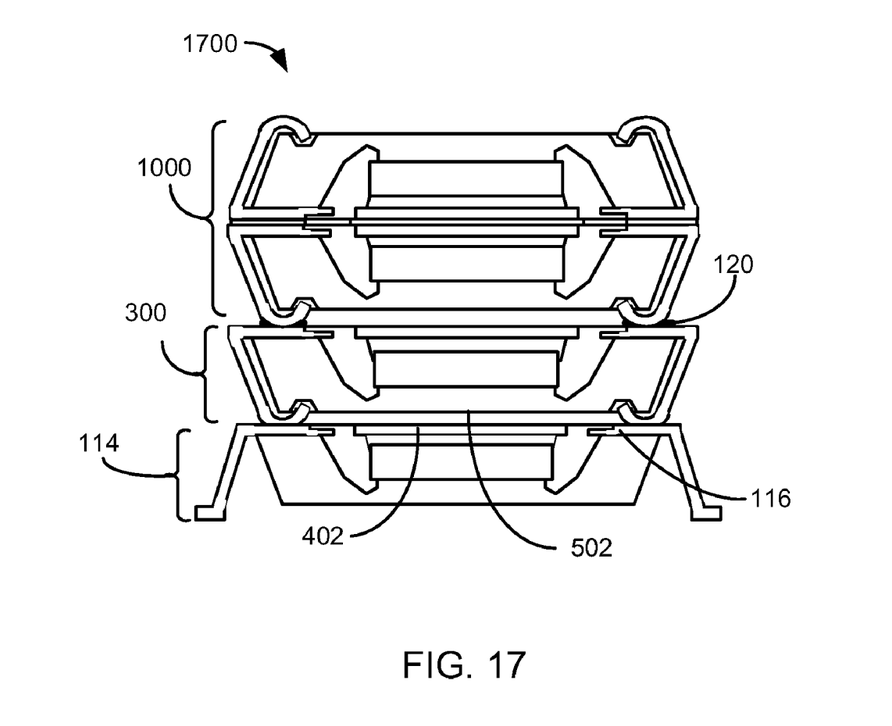
FIG. 17 is a cross-sectional view of the integrated circuit package to package stacking system, in a twelfth embodiment of the present invention.

Referring now to FIG. 17, therein is shown a cross-sectional view of an integrated circuit package to package stacking system 1700, in a twelfth embodiment of the present invention. The a cross-sectional view of the integrated circuit package to package stacking system 1700 depicts a four package stack comprising the second integrated circuit package 114, of FIG. 1, having the configured leadframe 116, such as a gull wing or J-lead leadframe, of FIG. 1, with the J-lead integrated circuit package 300, of FIG. 3, mounted in an inverted position and the integrated circuit package to package stacking system 1000, of FIG. 10, mounted on top. All of the individual integrated circuit packages are tested to be known good packages prior to assembly. An air gap formed by the exposed die pad 402, of FIG. 4, of the lower package and the package top 502, of FIG. 5, of the upper package allows a convection cooling between the packages.

Figure 18:
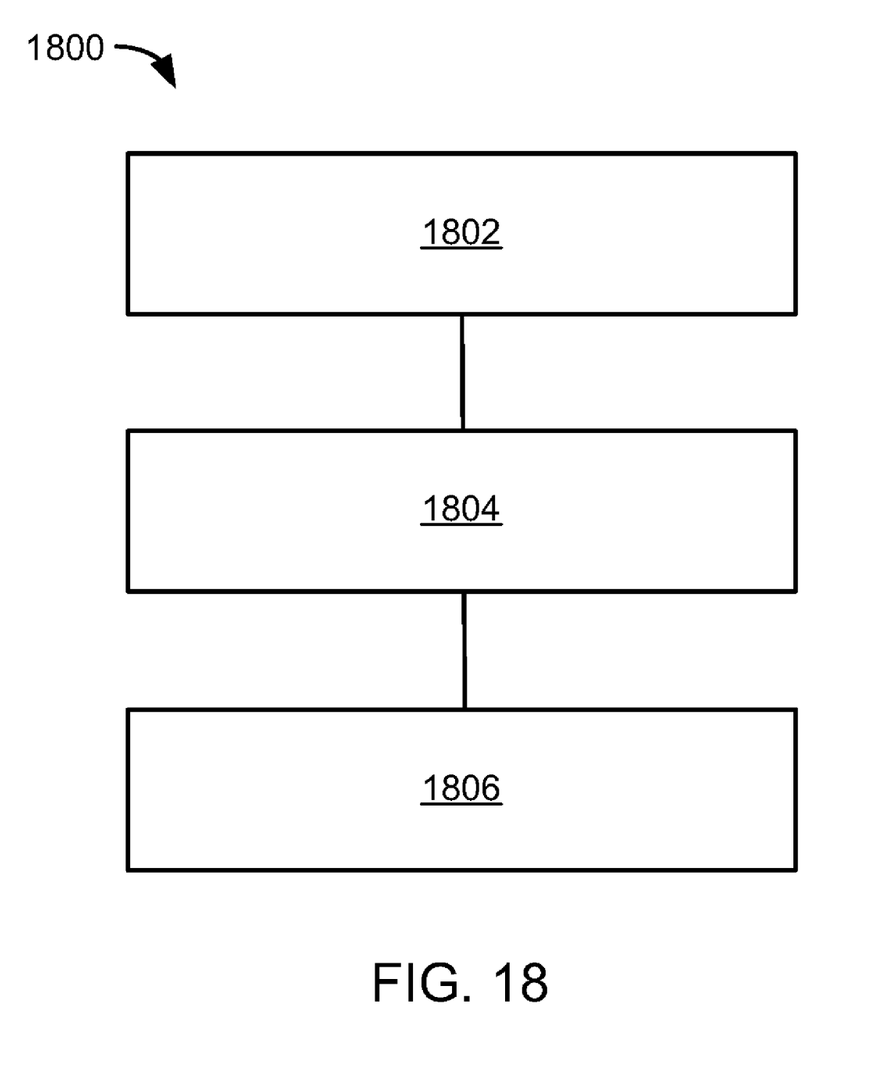
FIG. 18 is a flow chart of an integrated circuit package to package stacking system for manufacturing the integrated circuit package to package stacking system in an embodiment of the present invention.

Referring now to FIG. 18, therein is shown a flow chart of an integrated circuit package to package stacking system 1800 for manufacturing the integrated circuit package to package stacking system 100 in an embodiment of the present invention. The system 1800 includes providing a first integrated circuit package, having a configured leadframe in a block 1802; providing a second integrated circuit package, having the configured leadframe in a block 1804; and forming an integrated circuit package pair by electrically connecting the configured leadframe of the first integrated circuit package to the configured leadframe of the second integrated circuit package in a block 1806.

It has been discovered that the present invention thus has numerous aspects.

An aspect is that the present invention provides a high yield solution for increasing circuit density without consuming additional space on the printed circuit board.

Another aspect is this invention may be manufactured without an additional investment in new tooling. A minor modification to the existing tooling will allow additional flexibility as demonstrated in this specification.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package to package stacking system method and apparatus of the present invention furnish important and heretofore unknown and unavailable solutions, capabilities, and functional aspects for increasing the integrated circuit density of printed circuit boards. The resulting processes and configurations are straightforward, cost-effective, uncomplicated, highly versatile and effective, can be implemented by adapting known technologies, and are thus readily suited for efficiently and economically manufacturing integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method of manufacture of an integrated circuit package to package stacking system comprising: providing a first integrated circuit package and a second integrated circuit package, each having a configured leadframe with a J-lead and a die pad with a exposed lower surface at a bottom side of a package material; the configured leadframe extending out from the bottom side of the packaging material to a top side of the packaging material opposite from the bottom side, wherein an upper mounting surface of the configured leadframe is being exposed; and the configured leadframe interlocking in a lead recess in the top side of packaging material, wherein the lead recess is positioned away from an edge of the packaging material; forming an integrated circuit package pair by joining the exposed lower surface of the die pad of the first integrated circuit package to the exposed lower surface of the die pad of the second integrated circuit package, wherein the second integrated circuit package is in an inverted position and the first integrated circuit package is in an upright position; and forming a four-package stack by mounting the integrated circuit package pair on a third integrated circuit package and a fourth integrated circuit package, wherein the fourth integrated circuit package is electrically connected to the integrated circuit package pair and the third integrated circuit package.

2. The method as claimed in claim 1 further comprises: providing an integrated circuit; electrically connecting the integrated circuit to the configured leadframe; and encapsulating the integrated circuit and the configured leadframe, with the configured leadframe being partially exposed.

3. The method as claimed in claim 1 wherein:
exposing the upper mounting surface includes bending the configured leadframe having the J-lead beyond the packaging material; and
further comprising:
providing a lower mounting surface on the configured leadframe.

4. A method of manufacture of an integrated circuit package to package stacking system comprising: providing a first integrated circuit package and a second integrated circuit package, each having a configured leadframe with a J-lead and a die pad with an exposed lower surface at a bottom side of a packaging material; the configured leadframe extending out from the bottom side of the packaging material to a top side of the packaging material opposite from the bottom side, wherein an upper mounting surface of the configured leadframe is being exposed; and the configured leadframe interlocking in a lead recess in the to side of packaging material, wherein the lead recess is positioned away from an edge of the packaging material; forming an integrated circuit package pair by joining the exposed lower surface of the die pad of the first integrated circuit package to the exposed lower surface of the die pad of the second integrated circuit package, wherein the second integrated circuit package is in an inverted position and the first integrated circuit package is in an upright position; forming a four-package stack by mounting the integrated circuit package pair over and spaced away from a third integrated circuit package and on a fourth integrated circuit, wherein the fourth integrated circuit package is electrically connected to the integrated circuit package pair and the third integrated circuit package.

5. The method as claimed in claim 4 further comprises: mounting an integrated circuit on the die pad within the configured leadframe; electrically connecting the integrated circuit to the configured leadframe using electrical interconnects; and encapsulating the integrated circuit and the configured leadframe, with the configured leadframe being partially exposed.

6. The method as claimed in claim 4 further comprising using an interconnect material to electrically connect mounting surfaces between integrated circuit packages.

7. The method as claimed in claim 4 wherein the fourth integrated circuit package is mounted in an upright position.

8. An integrated circuit package to package stacking system comprising:
a first integrated circuit package and a second integrated package, each having a configured leadframe with a J-lead and; a die pad having a lower exposed surface at a bottom side of a packaging material; the configured leadframe extending out from the bottom side of the packaging material to a top side of the packaging material opposite from the bottom side, wherein an upper mounting surface of the configured leadframe is being exposed; and the configured leadframe interlocking in a lead recess in the top side of the packaging material, wherein the lead recess is positioned away from an edge of the packaging material; an integrated circuit package pair formed by joining the exposed lower surface of the die pad of the first integrated circuit package to the exposed lower surface of the die pad of the second integrated circuit package; a third integrated circuit package mounted on the integrated circuit package pair; and a fourth integrated circuit package electrically connected to and mounted on the integrated circuit package pair and the third integrated circuit package for forming a four-package stack.

9. The system as claimed in claim 8 wherein the integrated circuit package comprises:
an integrated circuit;
the integrated circuit electrically connected to the configured leadframe; and
the integrated circuit and the configured leadframe encapsulated, with the configured leadframe partially exposed.

10. The system as claimed in claim 8 wherein: the upper mounting surface includes the configured leadframe having the J-lead bent beyond the packaging material; and the configured leadframe further comprises a lower mounting surface.

11. The system as claimed in claim 8 wherein the third integrated circuit package is spaced away from the integrated circuit package pair.

12. The system as claimed in claim 11 wherein the integrated circuit package comprises: an integrated circuit mounted on the die pad within the configured leadframe; the integrated circuit electrically connected to the configured leadframe by electrical interconnects; and the integrated circuit and the configured leadframe are encapsulated, with the configured leadframe partially exposed.

13. The system as claimed in claim 11 further comprising: a lower mounting surface on the configured leadframe; and an interconnect material electrically connecting mounting surfaces between integrated circuit packages.

14. The system as claimed in claim 11 wherein the fourth integrated circuit package is mounted in an upright position.

* * * * *

UNITED STATES PATENT AND TRADEMARK OFFICE
CERTIFICATE OF CORRECTION

PATENT NO. : 8,395,251 B2
APPLICATION NO. : 11/382983
DATED : March 12, 2013
INVENTOR(S) : Shim et al.

Page 1 of 1

It is certified that error appears in the above-identified patent and that said Letters Patent is hereby corrected as shown below:

In the Specification:

Column 1, line 20, delete "Modem" and insert therefor --Modern--

In the Claims:

Column 9, claim 4, line 51, delete "in the to side of" and insert therefor --in the top side of--

Signed and Sealed this
Third Day of November, 2015

Michelle K. Lee
*Director of the United States Patent and Trademark Office*